US012658893B2

(12) United States Patent
Mallikarjunaswamy et al.

(10) Patent No.: US 12,658,893 B2
(45) Date of Patent: Jun. 16, 2026

(54) HVIC DEVICE WITH COMBINED LEVEL SHIFTER AND BOOST DIODE IN JUNCTION TERMINATION REGION

(71) Applicant: Alpha and Omega Semiconductor International LP, Toronto (CA)

(72) Inventors: Shekar Mallikarjunaswamy, San Jose, CA (US); Jongjib Kim, Santa Clara, CA (US); Son Tran, San Jose, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 881 days.

(21) Appl. No.: 17/892,007

(22) Filed: Aug. 19, 2022

(65) Prior Publication Data

US 2024/0063777 A1 Feb. 22, 2024

(51) Int. Cl.
| | |
|---|---|
| *H03K 3/011* | (2006.01) |
| *H03K 17/687* | (2006.01) |
| *H10D 30/65* | (2025.01) |
| *H10D 62/10* | (2025.01) |

(Continued)

(52) U.S. Cl.
CPC ........... *H03K 3/011* (2013.01); *H03K 17/687* (2013.01); *H10D 30/65* (2025.01); *H10D 62/109* (2025.01); *H10D 62/393* (2025.01); *H10D 64/112* (2025.01)

(58) Field of Classification Search
CPC ...... H03K 3/011; H03K 17/687; H10D 30/65; H10D 64/112; H10D 62/109; H10D 62/393
See application file for complete search history.

(56) References Cited

U.S. PATENT DOCUMENTS

| | | | |
|---|---|---|---|
| 9,466,972 | B2 | 10/2016 | Mallikarjunaswamy |
| 9,525,413 | B2 | 12/2016 | Roberts et al. |
| 9,825,162 | B2 | 11/2017 | Renaud et al. |

(Continued)

FOREIGN PATENT DOCUMENTS

| | | |
|---|---|---|
| TW | 201515389 A | 4/2015 |
| TW | 202145581 A | 12/2021 |

OTHER PUBLICATIONS

English translation of TW201515389.
English translation of TW202145581.

*Primary Examiner* — Jacob Y Choi
*Assistant Examiner* — Neil R Prasad
(74) *Attorney, Agent, or Firm* — JDI PATENT; Joshua D. Isenberg

(57) ABSTRACT

A power device, circuit and method of making are described. The power device circuit includes a semiconductor substrate composition having a substrate layer of a first conductivity type wherein the first conductivity type is opposite a second conductivity type. Two or more lateral double diffused metal oxide semiconductor (LDMOS) devices are formed in the substrate layer and integrated into an isolation region of a high voltage well, wherein each LDMOS is isolated from a power device substrate area by an isolator structure formed from the substrate layer. One or more boost structures are integrated into the isolation region of the high voltage well wherein the one or more boost structures are in contact with the high voltage well and extend into the isolation region of the high voltage well.

18 Claims, 6 Drawing Sheets

(51) Int. Cl.
    *H10D 62/17*      (2025.01)
    *H10D 64/00*      (2025.01)

(56)         References Cited

U.S. PATENT DOCUMENTS

| 10,141,325 | B2 | 11/2018 | Yamamoto et al. | |
|---|---|---|---|---|
| 10,147,801 | B2 | 12/2018 | Zuniga et al. | |
| 10,163,638 | B2 | 12/2018 | Ningaraju et al. | |
| 10,587,194 | B2 | 3/2020 | Kinzer | |
| 11,356,088 | B2 | 6/2022 | Chuang | |
| 2008/0224285 | A1* | 9/2008 | Lim | H01L 23/49575 |
| | | | | 257/E23.092 |
| 2010/0102386 | A1 | 4/2010 | You | |
| 2011/0148506 | A1 | 6/2011 | Korec et al. | |
| 2011/0169102 | A1 | 7/2011 | Uno et al. | |
| 2013/0015523 | A1 | 1/2013 | You | |
| 2016/0359478 | A1 | 12/2016 | Chuang | |
| 2018/0183435 | A1 | 6/2018 | Spiel | |
| 2019/0198666 | A1* | 6/2019 | Kim | H03K 17/122 |
| 2019/0259830 | A1 | 8/2019 | Parthasarathy et al. | |
| 2021/0111708 | A1 | 4/2021 | Liu | |
| 2022/0157982 | A1* | 5/2022 | Chiu | H10D 30/0285 |

* cited by examiner 402     402
401
FIG. 4A
402     403     402
401
FIG. 4B
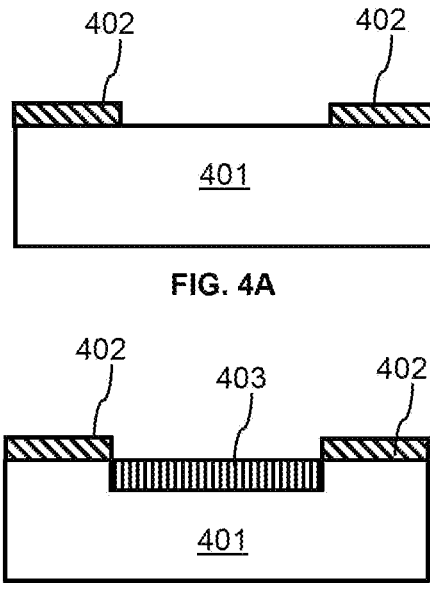
404
403
401
FIG. 4C
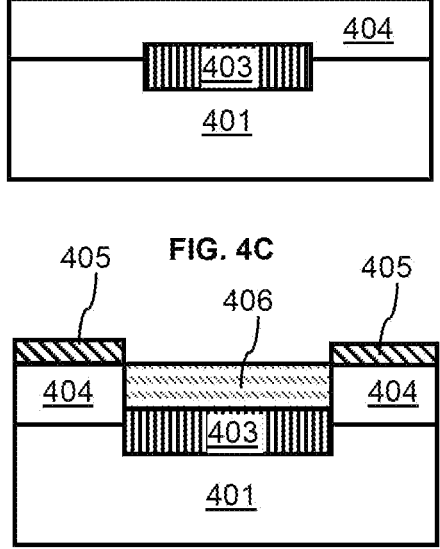
405     406     405
404     404
403
401
FIG. 4D

HVIC DEVICE WITH COMBINED LEVEL SHIFTER AND BOOST DIODE IN JUNCTION TERMINATION REGION

FIELD OF THE DISCLOSURE

Aspects of the present disclosure relate to high voltage semiconductor devices and the manufacturing process thereof and, in particular, to a power device having lateral double-diffused metal-oxide-semiconductor (LDMOS) transistors and a boost structure integrated with a junction termination region.

BACKGROUND OF THE DISCLOSURE

Lateral double-diffused metal-oxide-semiconductor (LD-MOS) transistors are commonly used in high-voltage applications (20 to 1200 volts) because of their high breakdown voltage characteristics and compatibility with low voltage complementary metal-oxide semiconductor (CMOS) technology. Thus, LDMOS transistors are a choice for High Voltage Integrated Circuit (HVIC) devices such as motor drivers and power inverters. In general, an N-type LDMOS transistor includes a polysilicon gate, an N+ source region formed in a P-type body region, and an N+ drain region. The N+ drain region is separated from the channel formed in the body region under the polysilicon gate by an N drift region. It is well known that by increasing the length of the N-drift region, the breakdown voltage of the LDMOS transistor can be accordingly increased.

Additionally, most current implementations of HVICs include external boost circuits. These external boost circuits require extra space for external boost circuitry packages and connections.

It is within this context that aspects of the present disclosure arise.

BRIEF DESCRIPTION OF THE DRAWINGS

The teachings of the present disclosure can be readily understood by considering the following detailed description in conjunction with the accompanying drawings, in which:

FIG. 4A, to 4H are cross-sectional diagrams depicting a method of manufacture for a deep buried layer in a high voltage well tub and boost structure in a power device according to aspects of the present disclosure.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom." "front." "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes, including changes in the order of process steps, may be made without departing from the scope of the present invention. The following detailed description, therefore, is not to be taken in a limiting sense, and the scope of the present invention is defined by the appended claims.

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (p or n) refers generally to a relative degree of concentration of designated type of net impurity carriers within a semiconductor material. In general terms, an n+ material has a higher n type net dopant (e.g., electron) concentration than an n material, and an n material has a higher carrier concentration than an n− material. Similarly, a p+ material has a higher p type net dopant (e.g., hole) concentration than a p material, and a p material has a higher concentration than a p− material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

The size of a device package for a power device having N-channel LDMOS transistors may be reduced by integrating the boost circuit into the substrate area of the power device. As such the improved power device according to aspects of the present disclosure integrates the boost structure into the isolation insulator structures of the substrate composition. Additionally, the power device may be further improved by maximizing the area of the boost structure by wrapping the boost structure around the high voltage well tub. A newly implemented deep buried layer further improves the breakdown voltage for the high voltage well tub and product robustness at high temperatures.

Figures 1A, 1B, 1C:
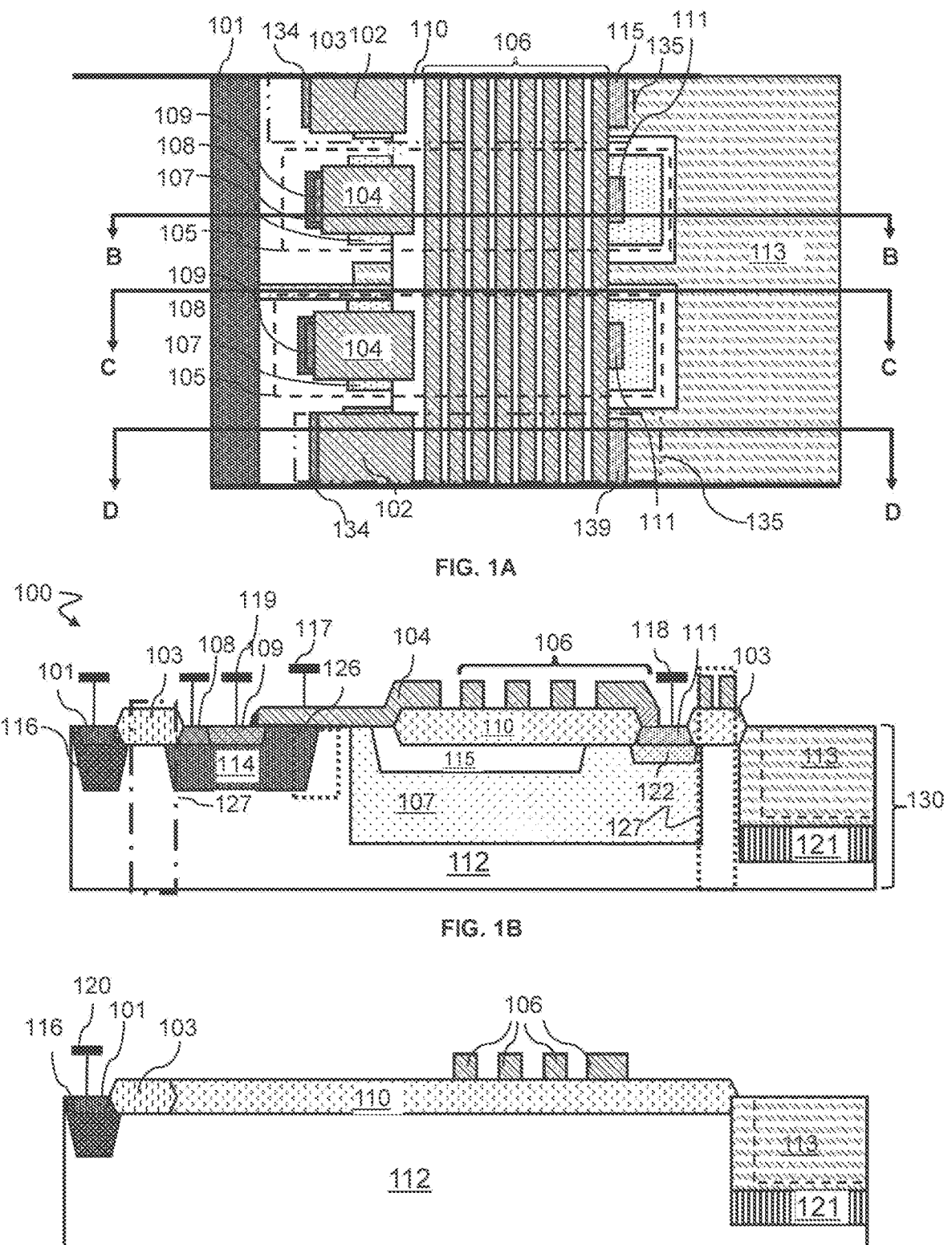
FIG. 1A depicts a top-down view of a power device having a plurality of N-channel LDMOS transistors and a high voltage well tub and a boost structure according to aspects of the present disclosure
FIG. 1B is a cross-sectional diagram showing an LDMOS device provided as a high voltage LDMOS taken along line B-B of FIG. 1A according to an aspect of the present disclosure.
FIG. 1C shows a cross sectional view of the isolator structure in the power device taken along line C-C of FIG. 1A according to an aspect of the present disclosure.

FIG. 1A depicts a top-down view of a power device having a plurality of N-channel LDMOS transistors 105 and a high voltage well tub 113 and a boost structure according to aspects of the present disclosure. The LDMOS transistors 105 are integrated into the isolation region of the high voltage well. Each transistor is isolated from the power device substrate area 101 and the high voltage well tub 113 by an isolation insulator structure 103. To reduce electric field crowding a plurality of floating conductive rings 106 that are continuous around the high voltage region of the power device and run over top the thick insulator layer and pass through the isolation insulator structure 103.

FIG. 1B is a cross-sectional diagram showing an LDMOS device 100 provided as a high voltage LDMOS according to an aspect of the present disclosure. This type of device can be formed in an N-type epitaxial layer, a P-type epitaxial layer or a P-type substrate. The N-channel LDMOS device 100 formed in either an epitaxial layer or a P-type substrate 112 includes a N+ source region 109 disposed in a P-well body region 114 and a N+ drain contact pickup region 111 over top a deep drain region 122 disposed in an N− deep well region 107. A P+ body pickup region 108 is also formed on a top portion of the P-well body region 114 laterally adjacent to the source region 109. A thick insulator layer 110 is formed on a top portion of the deep well region 107 right next to the drain contact pickup region 111 and an insulated gate 104 disposed on top of the P-well body region 114. The deep well region 107 extends from underneath a portion of an LDMOS gate 104 and underneath a portion of the thick insulator layer 110 and overlaps the LDMOS Drain regions 122 to an insolation isolator structure 127, which is a semiconductor region having the same conductivity type and doping concentration range as the substrate (or epi) 112 that surrounds the deep well region 107

A P type reduced surface field (RESURF) region 115 is formed in the deep well region A thin gate oxide (not shown) electrically insulates the gate 104 from the substrate 112. When an appropriate voltage is applied to the LDMOS gate 104, an active channel 126 forms in the P-well body region 114 underneath the gate 104 from the source region 109 to the P-N junction between the P-well body region 114 and the deep well region 107. The isolation insulator 103 lies over the isolator structure 127, which separates the high voltage LDMOS transistor 105 from the rest of the device. The isolator structure is not present in the well region 116 underneath the substrate contact area 101. Also shown are the contacts for the source 119, the gate 117, the drain 118 and the power device substrate 120. Turning again to FIG. 1A, each transistor in the plurality of LDMOS transistors 105 has a separate insulated gate 104 that is non-continuous with the gate 102 of a depletion mode transistor, e.g., a depletion mode MOSFET. In other words, the insulated gates 104 of the LDMOS transistors 105 interrupt the gates 102 of a depletion mode device.

FIG. 1C shows a cross sectional view of the isolator structure in the power device according to an aspect of the present disclosure. As shown, the thick insulator layer 110 extends nearly the entire length of the isolator structure and separates the LDMOS device from the heavily doped substrate contact area 101 and the less heavily doped substrate contact well 116 underneath. The floating electrically conductive rings 106 sit over top the thick insulator layer 110. The depletion mode transistor gate 102 does not extend over this region of the thick insulator layer 110.

Figure 1D:
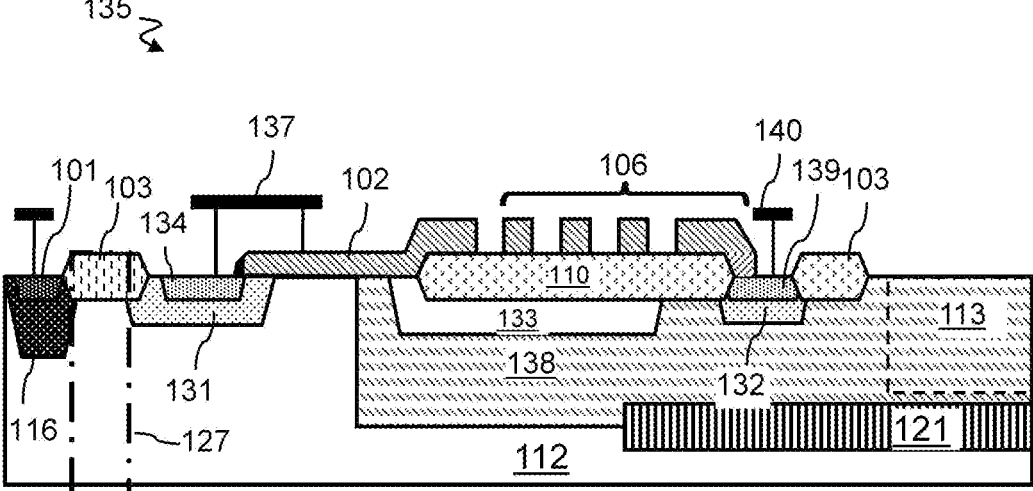
FIG. 1D depicts a cross-sectional view of a boost structure integrated into the isolation region of the substrate composition taken along line D-D of FIG. 1A according to aspects of the present disclosure.

FIG. 1D depicts a cross-sectional view of a boost structure 135 integrated into the isolation region 127 of the substrate composition 112. Here the depicted boost structure 135 is a metal oxide semiconductor field effect transistor that is normally on at zero gate-source voltage, also known as a depletion mode transistor. Here the depletion mode transistor is further configured to act as a boost diode with the source contact region 134 and depletion mode transistor gate 102 conductively coupled 137. The depletion mode transistor boost structure 135 includes a depletion mode transistor N+ source contact region 134 formed in a depletion mode transistor source region 131. The depletion mode transistor source region 131 is located in the substrate 112 between the depletion mode transistor gate 102, the N well region 107 and the isolation structure 127. The lightly doped substrate contact well 116 and the heavily doped substrate contact area 101 are isolated from the depletion mode transistor structure by the isolation structure 127. The high voltage well region 138 extends from underneath the depletion mode transistor gate 102 and underneath the insulator layer 110 to the high voltage well tub 113. A RESURF region 133 of the same conductivity type and doping concentration range as the substrate 112 is formed in the high voltage well region 138. A deep buried N layer 121 runs partially underneath the high voltage well region 138 and underneath a depletion mode transistor drain contact well region 132 and depletion transistor drain contact region 139. The depletion mode transistor drain contact well region 132 is more heavily doped with N-type ions than the high voltage well region 138 and the depletion mode transistor drain contact region 139 is more heavily doped with N-type ions than the depletion mode transistor drain contact well region 132. A drain contact 140 is conductively coupled to the drain contact region 139. The plurality of floating conductive rings 106 are continuous over the insulator layer 110 in the LDMOS devices depicted in FIG. 1B and in isolation region shown in FIG. 1C to the boost structure. The isolation insulator structure 103 may separate the active area of the depletion mode transistor from the high voltage well tub 113.

Figure 2:
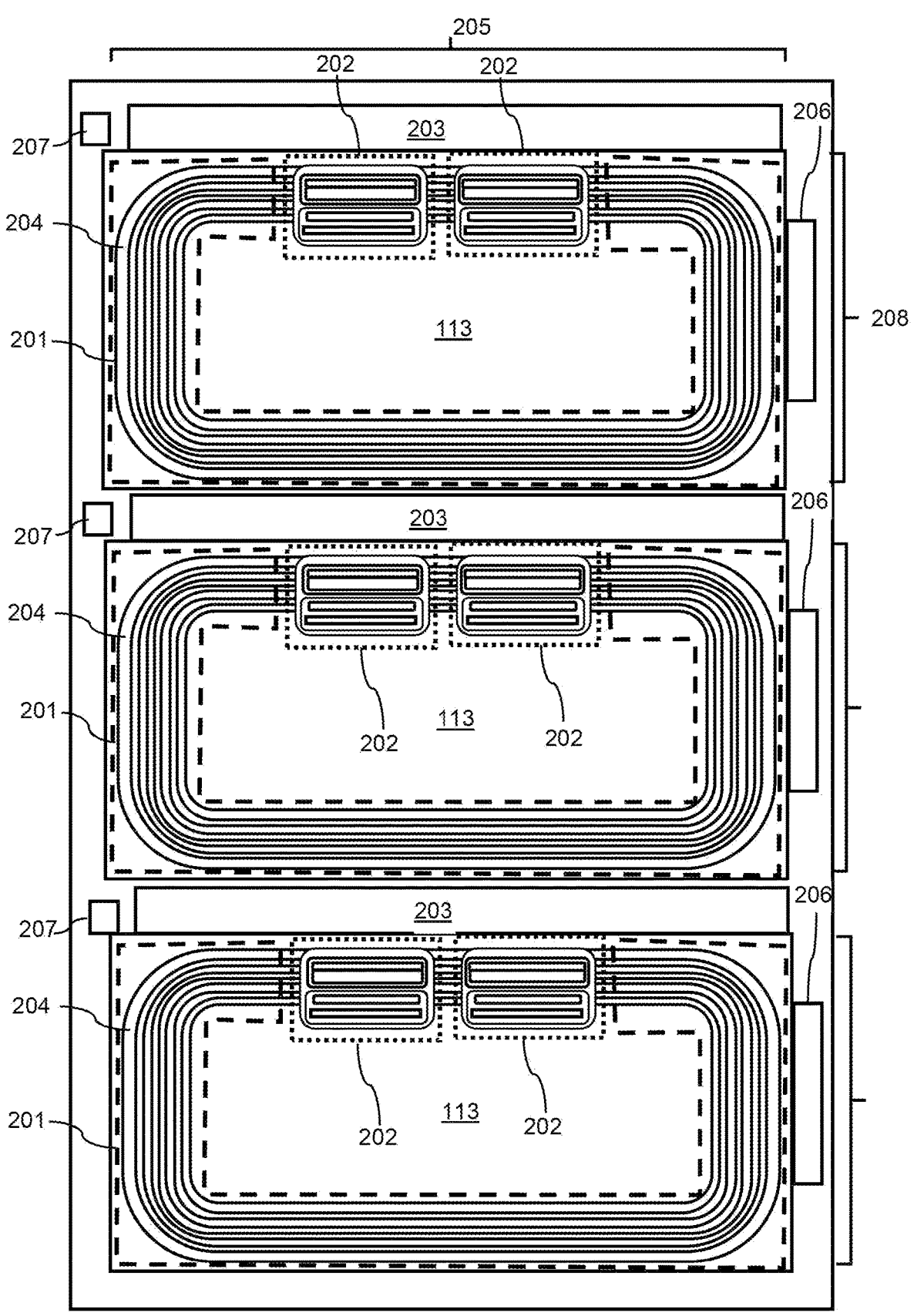
FIG. 2 is a top-down view of a three-phase driver using three power devices having boost structures according to aspects of the present disclosure

FIG. 2 is a top-down view of a three-phase driver using three power devices according to aspects of the present disclosure. As shown in this implementation, the boost structure 201 wraps around the high voltage well tub 113. Two level shifter LDMOS structures 202 are disposed on the edge of the high voltage well tub 113 in the isolation region 204. The isolation region 204 is continuous around the perimeter of the high voltage well tub 113, boost structure 201 and LDMOS structures 202. Low side circuitry 203 for each power device runs along a length of each power device 205. One or more blocking diodes 206 may run along a width of each power device 208. The length of each power device 205 may be longer than the width of each power device 208. Additionally, one or more blocking diodes 207 may be located near one or more the corners of each power device. The locations of the low side circuitry 203 and the blocking diodes 206, 207 provides the benefit of a more compact device package which integrates a blocking diode into the device substrate thus eliminating the need for an external blocking diode package. The boost structure 201 surrounding the high voltage well tub 113 maximizes the boost structure area reducing the resistance for the boost structure and eliminating the need for an external boost diode.

Figure 3:
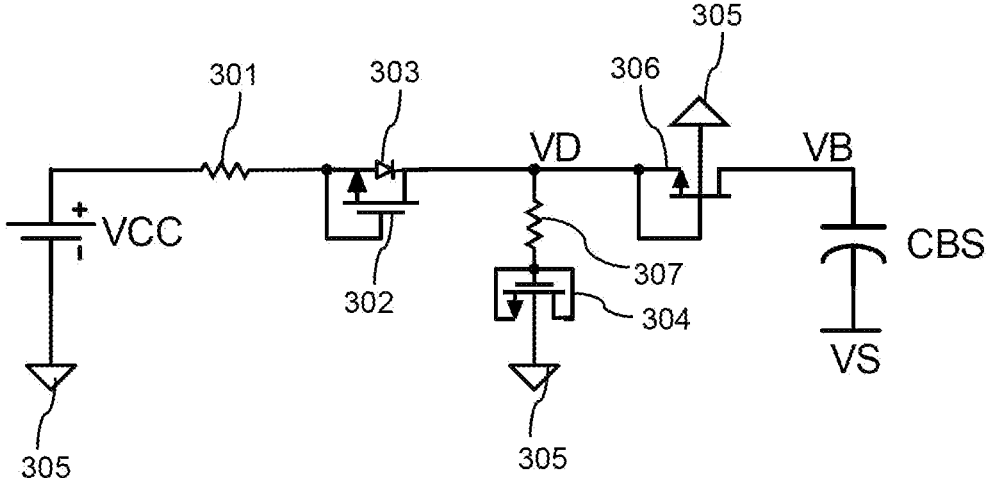
FIG. 3 depicts a circuit diagram for the boost structure in the power device according to an aspect of the present disclosure.

FIG. 3 depicts a circuit diagram for the boost structure in the power device having a boost structure according to an aspect of the present disclosure. In the implementation shown the circuit includes a voltage source VCC that is conductively coupled to the source and gate of a blocking diode 302. Here the blocking diode 302 is a MOSFET in a blocking diode configuration. Alternatively, the blocking diode may be implemented as a diode, a switch, or a voltage-controlled relay. The body diode 303 of the MOSFET 302 is arranged such that the cathode of the body diode is in series with the input of a Boost structure 306. A current limiting resistor 301 may be connected to the output of the voltage source VCC and the input of the blocking diode structure 302. The current limiting resistor 301 provides protection in the case boost node (VB) shorts to ground or goes to negative voltage and causes excessive current flow from VCC to VB. In addition, the resistor 301 also limits the current that flows back from VB to VCC if the blocking diode 302 gets short circuited or during an electrostatic discharge (ESD) event from VB to VCC.

Here, boost structure 306 is a depletion mode transistor, for example and without limitation, a depletion mode metal oxide semiconductor field effect transistor configured to operate as a boost diode. Alternatively, the boost diode may be implemented as a diode, a switch, or a voltage-controlled relay. The source and gate of the depletion mode transistor may be connected to the drain of the blocking MOSFET and the cathode of the body diode 303 of the blocking MOSFET. The bulk of the depletion mode transistor may be conductively coupled to a ground plane 305. The bulk coupling to the grand plane allows current to travel through the channel up to a pinch off voltage. The output of the boost structure 306, for example and without limitation, the drain of the depletion mode transistor, may be conductively coupled to a side VB of a polarized, output capacitor CBS. The boost structure 306 is configured to have a pinch off voltage that is higher than the operational voltage of the voltage source VCC. For example, and without limitation, the pinch off voltage may be 20 or more volts higher than the operational voltage. By way of example, the pinch off voltage may be less than 20 volts above the operational voltage if it has no impact during the boost capacitor charging cycle for the depletion mode transistor. By way of example, the minimum operational voltage may be between about 12 volts and about 20 volts.

A clamp 304 may be arranged in parallel with the boost structure 306. The clamp 304 may be, for example and without limitation an N-type MOSFET. The gate source and drain of the N-type MOSFET may be conductively coupled to the output of the blocking diode structure 303. The bulk of the N-type MOSFET may be connected to the ground plane 305. A protection resistor 307 may be placed between the clamp 304 and the output of the blocking diode structure 302 at VD. The protection resistor 307 protects the circuit from transients due to electro-static discharge.

During operation, current may flow from a source voltage VCC through the resistor 301 into the blocking diode structure. The blocking diode structure 303 with its gate and source conductively coupled to the voltage source conducts current until the voltage reaches the cut off voltage at which point the channel in the blocking diode is shut off and current only flows through the body diode 303 of the blocking diode structure 302. The current flows through the drain and VD to the source and gate of the boost structure 306. The bulk of the boost structure 306 is coupled to the ground plane 305. As the voltage increases the boost structure will allow current to flow from the source to the drain and slowly reduce conductance until the positive voltage reaches close to the source voltage VCC. Current conducted through the depletion transistor then flows to a side of the output capacitor, charging it. A clamp 304 connected to VD through the ESD protection resistor 307 further blocks reverse current flow shunting the reverse current through the bulk of the clamp to the ground plane 305. The clamp 304 provides a small leakage current path to protect the depletion source from bulk break down in case the depletions fail to pinch off and the node VD reaches the break down voltage of the clamp 304.

FIG. 4A through FIG. 4H depict a method of manufacture for a deep buried layer in a high voltage well tub and boost structure in a power device according to aspects of the present disclosure. The cross-sections shown in these drawings illustrate formation of structures in the termination area, such as the cross-section from source to drain for the level shifter LDMOS as in FIG. 1B, the cross section for the isolation as in FIG. 1C, or the cross-section from source to drain for the depletion mode transistor as in FIG. 1D.

FIG. 4A depicts a semiconductor substrate 401 having a first conductivity type. The Semiconductor substrate may be doped with ions of the first conductivity type to a doping concentration of between 1e13 and 1e14 cm$^{-3}$. A deep buried layer mask 402 may be formed over top the semiconductor substrate 401. The deep buried layer mask 402 may be applied using any suitable mask application and patterning methods for example and without limitation a photo-sensitive mask applied and patterned using photolithographic methods or a mechanically applied mask, such as a contact mask.

The first conductivity may be opposite a second conductivity type. For example, the first conductivity type may be P-type and the second conductivity type may be N-type or vice versa. A P-type semiconductor layer may be doped with ions such as, for example and without limitation, Boron, Aluminum, Gallium, and Indium which create electron acceptors when implanted in Silicon. Ions that create electron acceptors when implanted into Silicon are referred to herein as P-type ions. An N-type semiconductor layer may be doped with ions such as, for example and without limitation, Arsenic, Phosphorus, and Antimony which donate electrons when implanted in Silicon. Ions that donate electrons when implanted in silicon are referred to herein as N-type ions. Thus P-type as referenced herein is referred to as the opposite of N-type and vice versa.

As shown in FIG. 4B the deep buried layer 403 is then formed through the deep buried layer mask 402. The deep buried layer 403 may have the second conductivity type and may be formed by ion implantation doping into the substrate 401. For example, and without limitation, the deep buried layer may be N-type and the P-type substrate may be doped with N-type ions. The deep buried layer 403 may be implanted with a concentration of around 1e$^{18}$ cm$^{-3}$ or a resistivity of 5-10 Ohm per square. For ions such as Arsenic (As), Antimony (Sb), and Phosphorus (P) the doping concentration may be between 1e17 cm$^{-3}$ and 1e8 cm$^{-3}$ and the implantation energy may be between about 100 kilo electron volts (keV) and 1000 keV (1 MeV). After doping the deep buried layer mask 402 is removed. The deep buried layer mask may be removed by any mask removal means for example and without limitation, chemical washing, plasma ashing or planarization.

After formation of the deep buried layer 403 as shown in FIG. 4C a first epitaxial layer 404 is formed. The first epitaxial layer 404 may be formed on the surface of the substrate with any deposition method for example and without limitation, Physical Vapor deposition (PVD). After the first epitaxial layer 404 is formed, some of the deep buried layer 403 diffuses into the first epitaxial layer. As seen in FIG. 4D a deep high voltage well region mask 405 is applied to the surface of the substrate composition. The deep high voltage well mask 405 may be applied using any suitable mask application and patterning methods for example and without limitation photo lithographic methods or mechanical application methods. A deep high voltage well 406 may be formed through the deep high voltage well mask 405. The deep high voltage well 406 may be of the second conductivity type and be formed by any suitable doping method for example and without limitation, ion implantation. Doping of the deep high voltage well 406 may be performed to an ion concentration of between 1e$^{14}$ cm$^{-3}$ and $1e^{16}$ cm$^{-3}$ and at an implantation energy of between about 100 keV and about 1000 keV.

Figures 4E, 4F, 4G, 4H:
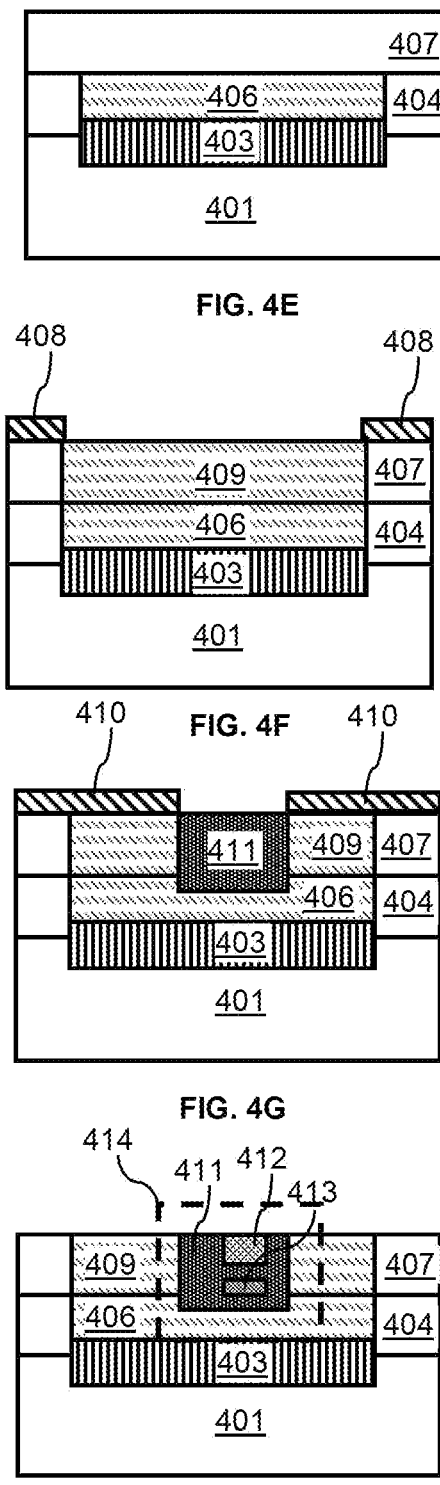

Next the Deep High Voltage Well Region mask 405 is removed by any suitable mask removal technique. Then as shown in FIG. 4E a second epitaxial layer 407 is created on top of the semiconductor substrate composition. The second epitaxial layer 407 may be formed by any suitable epitaxial growth method, for example and without limitation, PVD.

FIG. 4F shows that the top of the semiconductor substrate composition is then masked with a high voltage well mask 408. The high voltage well mask 408 may be applied and patterned using any suitable mask application and patterning methods. A high voltage well region 409 is then implanted through the high voltage well mask 408. The high voltage well region 409 may be implanted using any suitable ion implantation technique and may be doped with ions of the second conductivity type to a concentration of between $1e^{14}$ cm$^{-3}$ and $1e^{16}$ cm$^{-3}$ and an implantation energy of about 100 keV to about 700 keV. After implantation the high voltage well mask 408 is removed using any suitable mask removal method.

Then as shown in FIG. 4G the high voltage well mask 408 may be removed and a well region mask 410 is then formed overtop the substrate composition. The well region mask 410 may be formed and patterned by any suitable masking and patterning method. A well region 411 is then created through the well region mask 410. The well region 411 may have the first conductivity type and be formed by any suitable implantation method. The well region may be doped with ions of the first conductivity type to a concentration of between $1e^{15}$ cm$^{-3}$ and $2e^{16}$ cm$^{-3}$ at an implantation energy of about 50 keV to about 500 keV. The well region 411 has a significantly greater concentration of ions of the second conductivity type than the semiconductor substrate and epitaxial layers this results in some implementations of the well region having a resistivity of around 200 Ohms per square compared to the resistivity of the semiconductor substrate layers of around 500 Ohms per square.

Finally, as shown in FIG. 4H high side operation regions are formed within the high voltage well tub 414. Regions formed within the high voltage well tub may be for example, a base layer region 413 doped with ions of the first conductivity type and a region 412 doped with ions of the second conductivity type is drain in the high voltage well tub. These regions in the high voltage well tub may be formed by any suitable ion implantation method.

It should be noted that the above technique is described with regard to an N-type LDMOS device and depletion mode transistor, can be applied to both N-type and P-type LDMOS.

Aspects of the present disclosure provide for a compact design for a power device that eliminates the need for an external blocking diode while reducing the overall device footprint.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A power device, comprising:
   a) a semiconductor substrate composition having a substrate layer of a first conductivity type wherein the first conductivity type is opposite a second conductivity type;
   b) two or more lateral double diffused metal oxide semiconductor (LDMOS) devices formed in the substrate layer and integrated into an isolation region of a high voltage well, wherein each LDMOS device of the two or more LDMOS devices is isolated from a power device substrate area by an isolator structure formed from the substrate layer; and
   c) one or more boost structures integrated into the isolation region of the high voltage well wherein the one or more boost structures are in contact with the high voltage well and extend into the isolation region of the high voltage well; and d) a plurality of conductive electrically floating rings formed on top an insulation layer, wherein the plurality of conductive electrically floating rings are continuous over the isolator structure and the power device substrate area.

2. The power device of claim 1 wherein the one or more boost structures includes a boost diode.

3. The power device of claim 2 wherein the boost diode is a depletion mode transistor configured to function as a boost diode.

4. The power device of claim 1 wherein the one or more boost structures at least partially encircle the high voltage well.

5. The power device of claim 3 where in the depletion mode transistor includes:
   a deep well region of the second conductivity type formed in the substrate layer;
   a source region lightly doped with ions of the second conductivity type formed in the substrate layer and a source contact pick up region heavily doped with ions of the second conductivity type formed in the source region, wherein the source contact region is more heavily doped with ions of the second conductivity type than the source region;
   a drain region doped with ions of the second conductivity type formed in the deep well region wherein the drain region is more heavily doped with ions of the second conductivity type than the deep well region and a drain contact pickup region formed in the deep well region wherein the drain contact pickup region is more heavily doped with ions of the second conductivity type than the drain region;
   a gate formed on top an active channel region, the active channel being located between the source region and the deep well region, wherein the source contact pickup region and the gate are conductively coupled;
   a thick insulation layer formed on top the substrate composition between source region and the drain contact pickup region.

6. The power device of claim 5 further comprising a RESURF region of the first conductivity type formed in the deep well region between the source region and drain region.

7. The power device of claim 1 wherein the isolation region of the high voltage well includes a continuous region of the first conductivity type that surrounds the high voltage well.

8. The power device of claim 1, wherein a portion of the plurality of conductive electrically floating rings formed on top of the insulation layer overlies a portion of the high voltage well.

9. The power device of claim 1 further comprising a deep buried semiconductor layer of second conductivity type underneath a high side well region of the second conductivity type.

10. The power device of claim 9 wherein the deep buried semiconductor layer extends from the high voltage well underneath a drain region of the one or more boost structures.

11. The power device of claim 1 further comprising, a power transistor low side structure extending along a length of the high side tub and separated from the high side tub by the isolation region.

12. The power device of claim 1 further comprising a blocking diode structure extending along a width of the high side tub and separated from the high side tub by the isolation region, wherein the blocking diode is integrated into the semiconductor substrate composition.

13. The power device of claim 1 further comprising a blocking diode structure located proximate a corner of the side tub and separated from the high side tub by the isolation region, wherein the blocking diode is integrated into the semiconductor substrate composition.

14. The power device of claim 1 further comprising a first blocking diode structure extending along a width of the high side tub and separated from the high side tub by the isolation region and a second blocking diode structure located proximate a corner of the side tub and separated from the high side tub by the isolation region, wherein the second blocking diode is integrated into the semiconductor substrate composition.

15. The power device of claim 1 further comprising low-side circuitry for the power device extending along a length of the high side tub and separated from the high side tub by the isolation region, wherein the low-side circuitry is integrated into the semiconductor substrate composition.

16. The power device of claim 1 further comprising a blocking diode structure extending along a width of the high side tub and separated from the high side tub by the isolation region, wherein the blocking diode is integrated into the semiconductor substrate composition, and low-side circuitry for the power device extending along a length of the high side tub and separated from the high side tub by the isolation region, wherein the low-side circuitry is integrated into the semiconductor substrate composition.

17. The power device of claim 1 further comprising a blocking diode structure located proximate a corner of the high side tub and separated from the high side tub by the isolation region, wherein the blocking diode is integrated into the semiconductor substrate composition, and low-side circuitry for the power device extending along a length of the high side tub and separated from the high side tub by the isolation region, wherein the low-side circuitry is integrated into the semiconductor substrate composition.

18. The power device of claim 1 further comprising a first blocking diode structure extending along a width of the high side tub and separated from the high side tub by the isolation region and a second blocking diode structure located proximate a corner of the side tub and separated from the high side tub by the isolation region, wherein the second blocking diode is integrated into the semiconductor substrate composition, and low-side circuitry for the power device extending along a length of the high side tub and separated from the high side tub by the isolation region, wherein the low-side circuitry is integrated into the semiconductor substrate composition.

* * * * *